United States Patent [19]

Brusati et al.

[11] Patent Number: 5,467,254

[45] Date of Patent: Nov. 14, 1995

[54] SUPPORTIVE GUIDE FOR CIRCUIT-CARD GROUNDING INCLUDING TRACKS HAVING STAGGERED PROTRUSIONS AT THE PROXIMAL END OF THE TRACKS

[75] Inventors: Peter V. Brusati, Hayward; J. Dewey Griffin, Milpitas; Derek J. Sakazaki, Redwood City, all of Calif.

[73] Assignee: SynOptics Communications, Inc., Santa Clara, Calif.

[21] Appl. No.: 147,870

[22] Filed: Nov. 4, 1993

[51] Int. Cl.⁶ .............................. H05K 7/14; H05K 9/00
[52] U.S. Cl. ............... 361/799; 174/35 R; 361/753; 361/756; 361/800; 361/802; 361/816; 361/818
[58] Field of Search ............... 174/35 R, 35 C, 174/35 TS, 51; 211/41; 361/220, 730, 736, 741, 752, 753, 756, 757, 796, 797, 798, 799, 800, 801, 802, 816, 818, 212; 439/152, 153, 157, 160, 325, 326, 328, 345

[56] References Cited

U.S. PATENT DOCUMENTS

| | | | |
|---|---|---|---|
| 3,950,057 | 4/1976 | Calabro | 361/802 |
| 4,019,099 | 4/1977 | Calabro | 361/756 |
| 4,098,046 | 7/1978 | Papa | 361/802 |
| 4,335,819 | 6/1982 | Weisman et al. | 361/802 |
| 4,377,315 | 3/1983 | Grau | 439/64 |
| 4,534,472 | 8/1985 | Hanseler et al. | 361/802 |
| 4,780,570 | 10/1988 | Chuck | 361/818 |
| 4,821,145 | 4/1989 | Corfits et al. | 174/35 R |
| 4,864,458 | 9/1989 | Demorat, Jr. et al. | 361/212 |
| 4,872,212 | 10/1989 | Roos et al. | 361/752 |
| 4,976,358 | 12/1990 | Stickel et al. | 211/41 |
| 5,055,061 | 10/1991 | Lichtenwalter | 361/802 |
| 5,157,590 | 10/1992 | Barthel et al. | 361/752 |
| 5,187,648 | 2/1993 | Ito | 361/818 |
| 5,251,109 | 10/1993 | Baitz | 361/752 |

FOREIGN PATENT DOCUMENTS

3-224298  10/1991  Japan .................................. 361/799

*Primary Examiner*—Donald A. Sparks
*Attorney, Agent, or Firm*—Blakely, Sokoloff, Taylor & Zafman

[57] ABSTRACT

A supportive guide for circuit-card grounding comprises a conductive strip (40) attached to a base of an elongated track (50) that has a U-shaped cross-section defining a longitudinal slot (52) and staggered protrusions (68,70) located at the proximal end of the trak. The strip contains a plurality of spring contacts (42) protruding into the slot via a plurality of openings (60), formed in the base of the track. Snap-in posts anchor the base of the track to a chassis (84) such that the conductive strip is sandwiched therebetween.

16 Claims, 7 Drawing Sheets

SUPPORTIVE GUIDE FOR CIRCUIT-CARD GROUNDING INCLUDING TRACKS HAVING STAGGERED PROTRUSIONS AT THE PROXIMAL END OF THE TRACKS

FIELD OF THE INVENTION

The present invention relates to grounding devices, specifically to a circuit-card grounding guide for reducing electromagnetic interference.

BACKGROUND OF THE INVENTION

Problems associated with electromagnetic interference (EMI) are commonly encountered in the field of electronics. EMI is of particular interest in networking, telecommunications, and data-processing systems. Electronic components of such systems generate electromagnetic fields that interfere with the operation of other internal components, often causing malfunction thereof. Similarly, EMI produced by electronic devices, e.g., computers, adversely affects the performance of neighboring appliances, such as printers, telephones, etc.

Electronics systems may comprise a conductive chassis that houses a plurality of printed circuit (PC) boards, otherwise known as circuit cards. Electrical-current discontinuities, or gaps, between the cards and the chassis allow electromagnetic radiation to emanate, thus producing EMI. However, it is known in the art that electromagnetic radiation of a particular frequency is attenuated as the size of the discontinuities is reduced below half the radiation wavelength. Therefore, EMI can be minimized by properly grounding the cards to the chassis.

Electrical connections between the conductive chassis and the circuit cards are necessary also because the chassis is typically utilized as an electrical ground required for the operation of individual PC boards. Because of the high density of electronic components mounted on a typical PC board, most boards require a plurality of independent grounding points to fully satisfy their grounding needs.

Currently, several types of grounding mechanisms are known and utilized. For example, grounding guides that allow a circuit card to be slidingly installed into the chassis are manufactured by Unitrack Industries, Inc., West Chester, Pa.

Figures 1, 2:
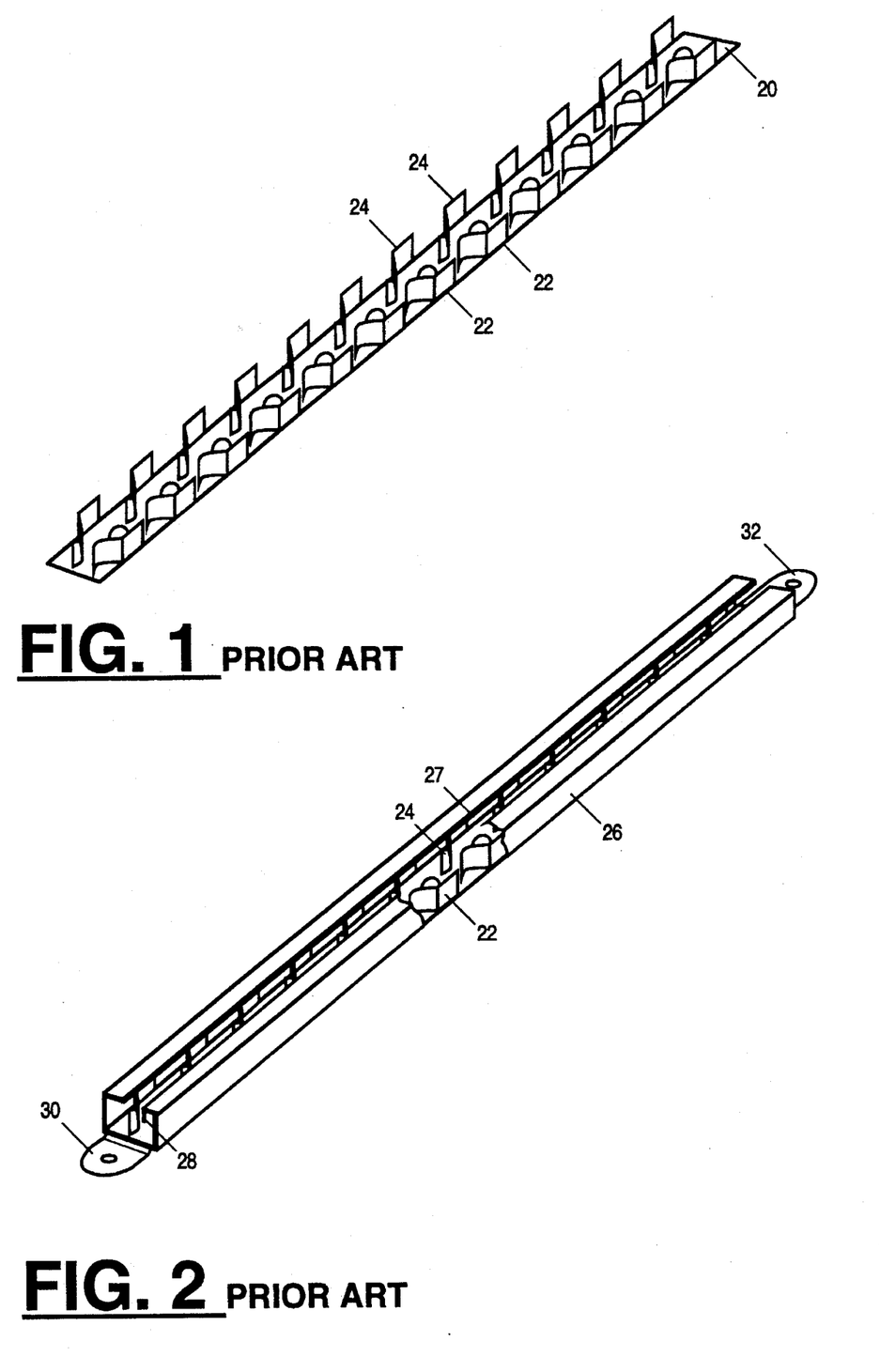
FIG. 1 is a perspective view showing a conductive strip of a prior-art card guide.
FIG. 2 is a perspective view of an assembled prior-art card guide, whose conductive strip is illustrated in FIG. 1.

As shown in FIG. 1, each of these guides comprises a conductive strip 20 that includes two corresponding pluralities of paired resilient fingers 22 and 24, evenly spaced along the strip. Strip 20 is inserted into a conductive track 26 (FIG. 2) having a longitudinal slot 27 and a flange 28 formed so that fingers 22 engage the flange to produce electrical continuity between strip 20 and track 26. Tabs 30 and 32 are provided at each end of track 26 for attaching the card guide to a chassis (not shown) and for retaining strip 20 inside the track.

As an edge of a circuit card (not shown) is inserted into slot 27, it slides between flange 28 and fingers 24. To accommodate the card, the resilient fingers are displaced laterally. Thus, the circuit card is electrically interconnected with strip 20 via a plurality of fingers 24, each having a contact patch formed as a point contact. Similarly, the strip has a corresponding number of electrical connections, i.e., fingers 22, with track 26. In turn, the track is grounded with screw-type fasteners (not shown), anchoring tabs 30 and 32 to the chassis.

However, the above-described card guide possesses a number of salient flaws. Specifically, the guide provides insufficient grounding of the circuit card to the chassis since the former is grounded to the latter only by two fasteners that attach tabs 30 and 32 to the chassis. Thus, an electrical discontinuity is created between the card and the chassis along the length of the track, which separates the two fasteners. Such a discontinuity allows generation of EMI.

Additionally, the card is grounded to the chassis indirectly because the resilient fingers of the conductive strip electrically couple the card only to the track, whereas the track is then grounded to the chassis by means of mounting tabs and fasteners. Therefore, even if additional grounding points were provided between the track and the chassis, a direct electrical connection between the card and the chassis still would not be established. Moreover, introduction of such grounding points in the form of rivets or screws significantly increases the manufacturing costs.

Furthermore, since the guides are rarely removed from the chassis, track-to-chassis attachment points are subject to corrosion that causes deterioration of the grounding connections. Similarly, because fingers 22 are fixed with respect to flange 28, corrosion may also produce the loss of electrical continuity between the fingers and the flange.

Although corrosion between the card and the guide is insignificant since the card is periodically removed from and replaced into the guides, the prior-art guides present a different set of problems. As the card is repeatedly inserted into and extracted from the guides, material is removed from the face of the card because the point contacts of fingers 22 apply relatively large forces over a small area of the card. Hence, excessive galling produced along one face of the card is another drawback associated with the prior-art guide. The resulting metal debris may contaminate electronic components located within the chassis, causing them to malfunction. Moreover, the high pressure exerted by the resilient fingers on the face of the circuit card increases the possibility of damage to the contacts due to snagging. Also, as the face of the card becomes abraded, the coefficient of friction between fingers 22 and the card increases, making it difficult to slide the card in and out of the guide. Furthermore, the circuit card is not inherently centered between its respective guides. The lack of centering may hinder positive engagement between the connectors located on the leading edge of the card and the mating connectors situated on the back plane of the conductive chassis.

Additionally, the insertion of the circuit card into the guides is cumbersome since the track slots are relatively narrow and aligning both edges of the card with the slots of the corresponding tracks requires increased time and effort.

SUMMARY OF THE INVENTION

It is accordingly an object of the invention to provide supportive guides for circuit-card grounding which overcome the foregoing disadvantages, e.g., which deliver a multiplicity of grounding connections; which directly ground the circuit card to the chassis; which provide corrosion-free grounding contacts; which reduce the sliding friction of the circuit card; which minimize material galling; which facilitate insertion of the circuit card into the chassis; which automatically center the card between the facing chassis members bearing the guides; and which are simple and inexpensive to manufacture and assemble. Further objects and advantages will become apparent after consideration of the ensuing description and the accompanying drawings.

The card guide according to the present invention comprises a conductive strip attached to a base of an elongated supporting track that has a U-shaped cross-section defining a longitudinal slot and staggered protrusions located at the proximal end of the tracks. The strip contains a plurality of longitudinally oriented spring contacts protruding into the slot via a plurality of openings formed through the base of the track. Snap-in fasteners anchor the base of the track to the chassis so that the conductive strip is sandwiched therebetween.

When the edge of a circuit card is inserted into the slot of the supporting track, the spring contacts are deflected to engage the chassis, thus electrically grounding the circuit card. To facilitate the insertion of the card into the slot, a V-shaped protrusion is formed on the front portion of the track.

BRIEF DESCRIPTION OF THE DRAWINGS

The present invention is illustrated by way of example, and not by way of limitation, in the figures of the accompanying drawings, where.

For purposes of illustration, these figures are not necessarily drawn to scale. In all of the figures, like components are designated by like reference numerals.

DETAILED DESCRIPTION

Throughout the following description, specific details, such as materials, dimensions, etc., are set forth in order to provide a more thorough understanding of the invention. However, the invention may be practiced without these particulars. In other instances, well known elements have not been shown or described to avoid unnecessarily obscuring the present invention. Accordingly, the specification and drawings are to be regarded in an illustrative, rather than a restrictive, sense.

Figure 3:
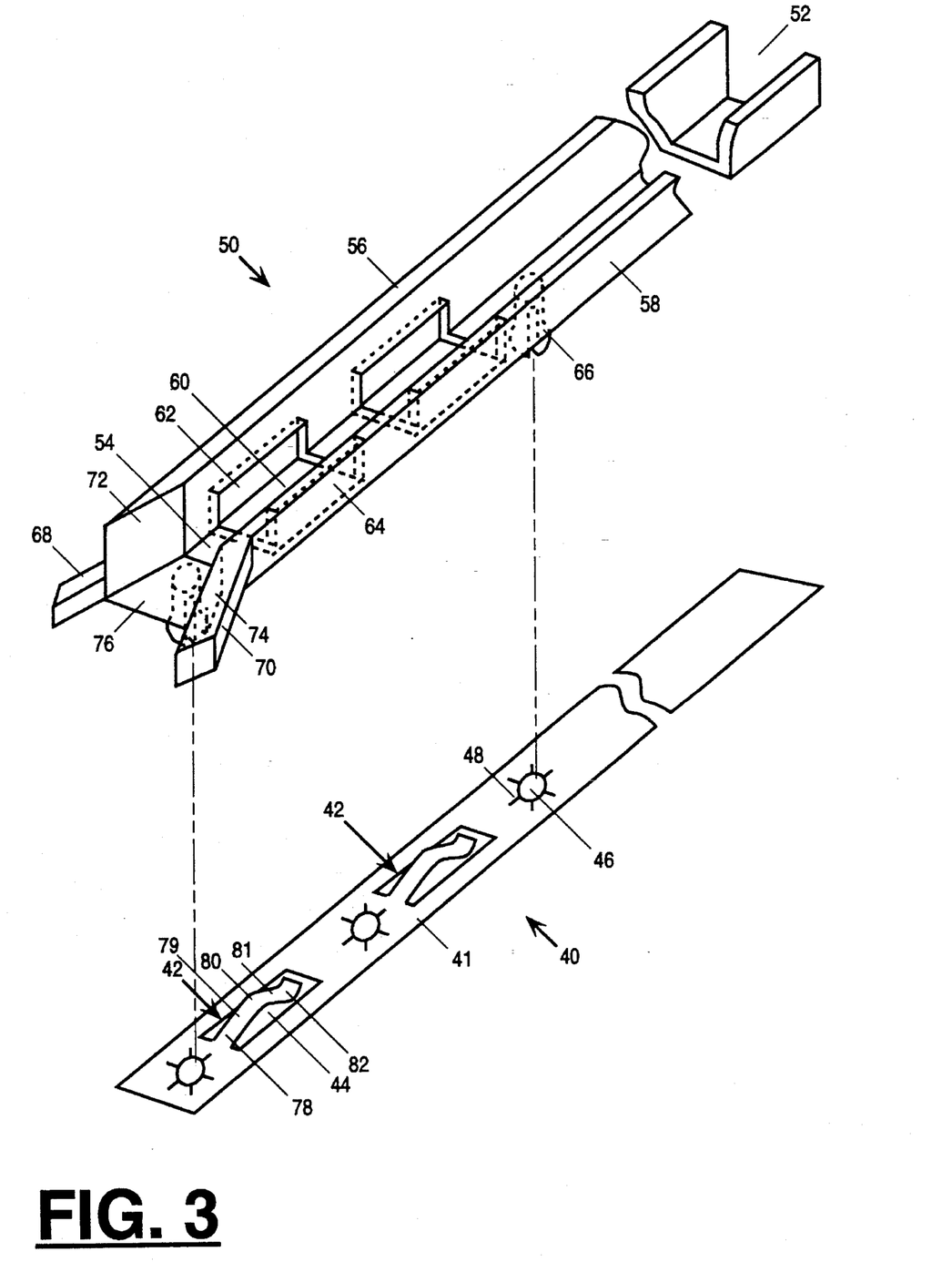
FIG. 3 is an exploded perspective view of a supportive guide for circuit-card grounding according to the invention.

FIG. 3 shows a perspective view of a supportive guide for circuit-card grounding according to the invention. Guide 38 includes a grounding strip 40, which is made of a conductive material, such as beryllium copper. The strip comprises a flat section 41 having a plurality of longitudinally oriented resilient contacts, i.e., leaf-spring members 42. The flat section is approximately 0.1 mm thick. Each leaf-spring member is integral with section 41 and is formed by partially separating a rectangular ribbon of material from the section. The resulting apertures in section 41 are then enlarged to create a plurality of rectangular openings 44, having a length of approximately 19 mm and a width of about 3.8 mm. Additionally, section 40 possesses a plurality of evenly-spaced openings 46, each having an oval shape and serrations 48 at its periphery.

Openings 46 are used for coupling strip 40 to a track 50, which has a U-shaped cross-section defining a centrally-disposed longitudinal slot 52. Track 50 is made of a polycarbonate resin. Slot 52 is bounded by a base portion 54 and two lateral portions 56 and 58, orthogonal to portion 54. The slot is about 2 mm wide. A plurality of evenly-spaced rectangular cavities 60 are disposed in the base portion for receiving leaf-spring members 42. The cavities are approximately 19 mm long and 3.6 mm wide. Since cavities 60 are slightly wider than slot 52, hollows 62 and 64 are formed in lateral portions 56 and 58, respectively.

Track 50 also possesses a plurality of snap-in posts 66 spaced to be received within openings 46. The proximal end of the track contains staggered protrusions 68 and 70, obliquely disposed with respect to the longitudinal axis of track 50. The protrusions define an angle of approximately 33° and are staggered to permit protrusion 68 of one track to overlap with protrusion 70 of the neighboring track (or vice versa), thus allowing the tracks to be positioned closely together. At the proximal end of track 50, the inner faces of lateral portions 56 and 58 have oblique planes 72 and 74, whereas base portion 54 contains a ramp 76. Planes 72 and 74 are beveled flush with protrusions 68 and 70.

Figure 4:
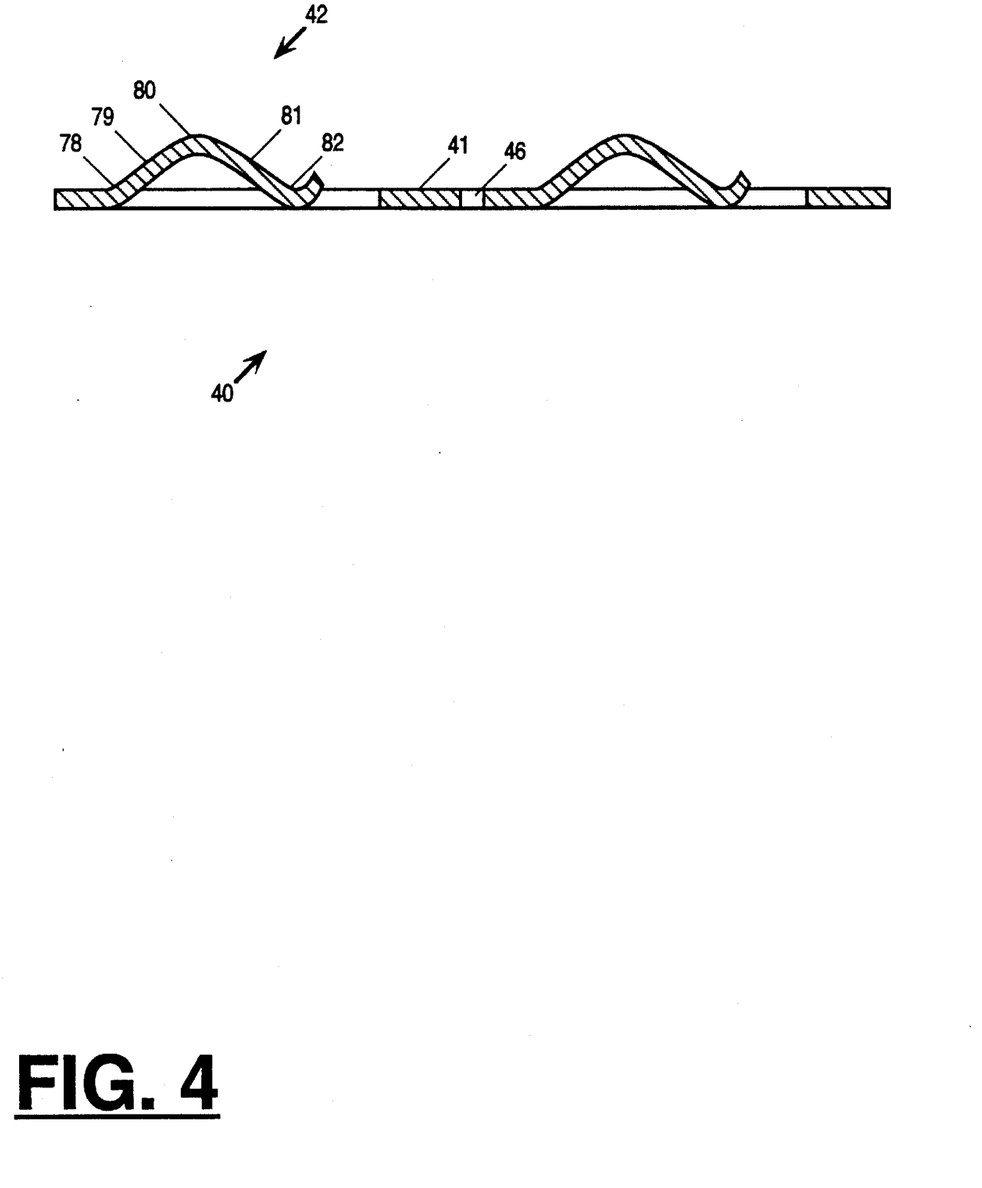
FIG. 4 is a longitudinal sectional view of a conductive strip of the supportive guide shown in FIG. 3.

Each leaf-spring member 42 is about 2.7 mm wide and has a total length of about 17 mm when extended. Members 42 each comprise a curved base portion 78, which is attached to section 40 of the strip; a first straight segment 79; a curved mid portion 80; and second straight segment 81 having a radiused tip 82. As shown in FIG. 4, when member 42 is in its neutral (uncompressed) state, the trough of tip 82 is coplanar with section 41. The radius of portion 78 is approximately 3.2 mm. Portion 80 also has a radius of about 3.2 mm and its crest is located approximately 4 mm above the top surface of section 41. The radius of tip 82 is about 0.4 mm and the end of the tip protrudes approximately 0.25 mm above the top surface of section 41. Segments 79 and 81 define an angle of about 105°.

The spacing between members 42 is optimized to minimize EMI and to provide a low-impedance electrical path. It is known in the art that to attenuate electromagnetic radiation of a particular frequency, the grounding-contact spacing should be less than half the wavelength of that radiation. Moreover, to provide a low-impedance ground, the contact spacing should be less than a quarter wavelength of emitted electromagnetic radiation. In accordance with the above guidelines, the spacing between members 42 has been set at approximately 32 mm.

As shown in FIG. 3, to assemble the guide, strip 40 is oriented such that portions 78 of members 42 are facing towards the proximal end of track 50. The strip is attached to the track by snap-in posts 66, inserted into corresponding openings 46. Serrations 48 allow the openings 46 to deform temporarily so that insertion of fasteners 66 into the openings is facilitated. The oval shapes of openings 46 compensate for manufacturing and thermal dimensional variations of track 50.

Figure 5:
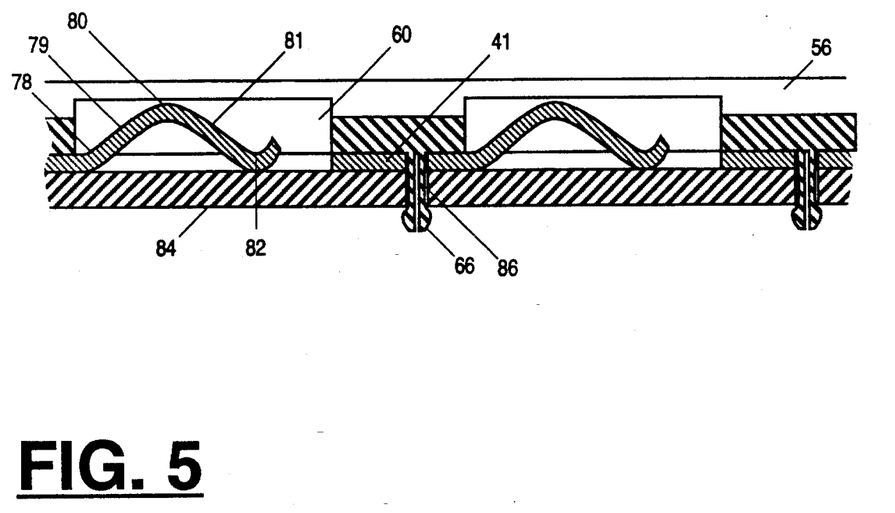
FIG. 5 is a longitudinal sectional view showing the guide of FIG. 3 attached to a conductive chassis.

As illustrated in FIG. 5, strip 40 is sandwiched between track 50 and a conductive chassis 84 when the assembled grounding guide is installed into the chassis by snapping fasteners 66 into appropriate mounting holes 86. Since slot 52 is narrower than members 42 and openings 60 are too shallow to accommodate members 42 in their neutral state, the leaf-spring members are preloaded against the body of chassis 84.

Figure 6:
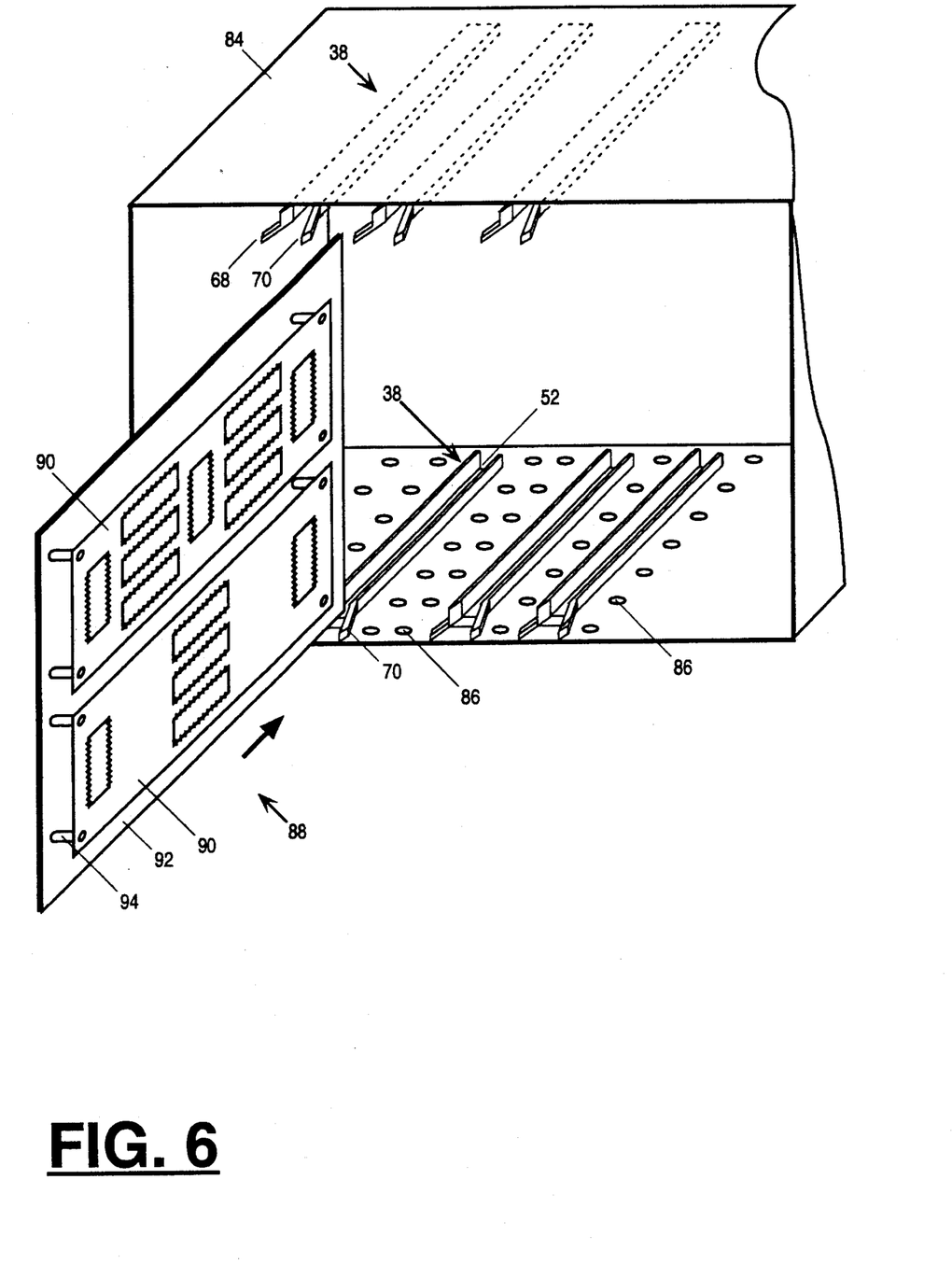
FIG. 6 is a perspective view illustrating the mounting arrangement of a circuit card in the conductive chassis of FIG. 5.

FIG. 6 shows a circuit card 88 to be inserted into chassis 84. The circuit card includes PC boards 90, grounded to a backing plate 92 with supports 94. The backing plate is made of a conductive material, e.g., stainless steel, and is about 1.6 mm thick. Protrusions 68 and 70 facilitate the introduction of card 88 into guides 38 by directing the edges of plate 92 into slots 52.

Figure 7:
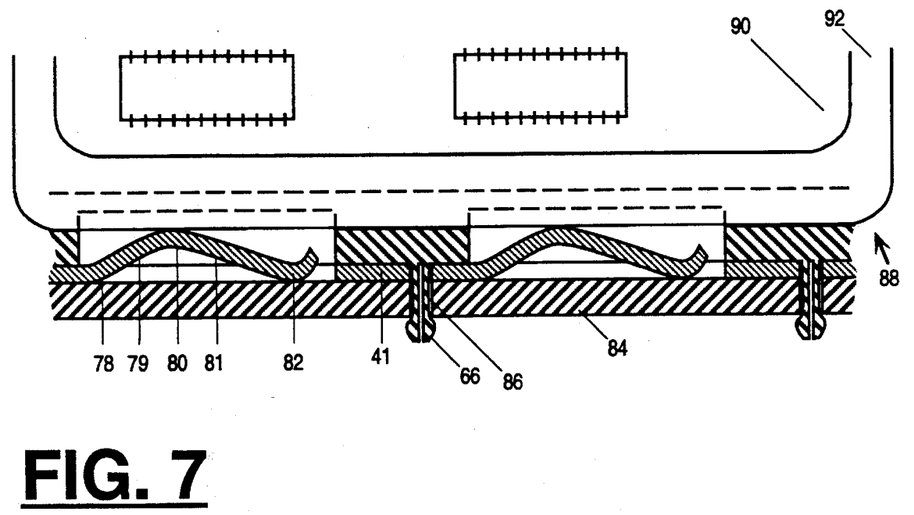
FIG. 7 shows the circuit card of FIG. 6 inserted in the guide of FIG. 5.

Once in the slots, the edges of plate 92 displace members 42, forcing tips 82 against chassis 84 (FIG. 7). Therefore, card 88 is grounded directly to the chassis with a plurality of electrical contacts, allowing to minimize EMI and providing a low-impedance connection between the card and the chassis.

Each time card 88 is inserted into guides 38, tips 82 of the leaf-spring members reengage the body of the chassis to establish a fresh ground between card 88 and chassis 84. The radius of each of the tips is small enough to deliver a positive grounding point yet large enough to prevent excessive galling of the chassis and accidental snagging of the tip. Furthermore, opposing forces exerted on the backing plate of card 88 by leaf-spring members of corresponding guides 38 automatically center the card between the guides. Because of this inherent centering, misalignment between electrical connectors 100 on the leading edge of the circuit card and mating connectors 102 located on the back plane of the chassis (FIG. 8) is eliminated.

Figure 9:
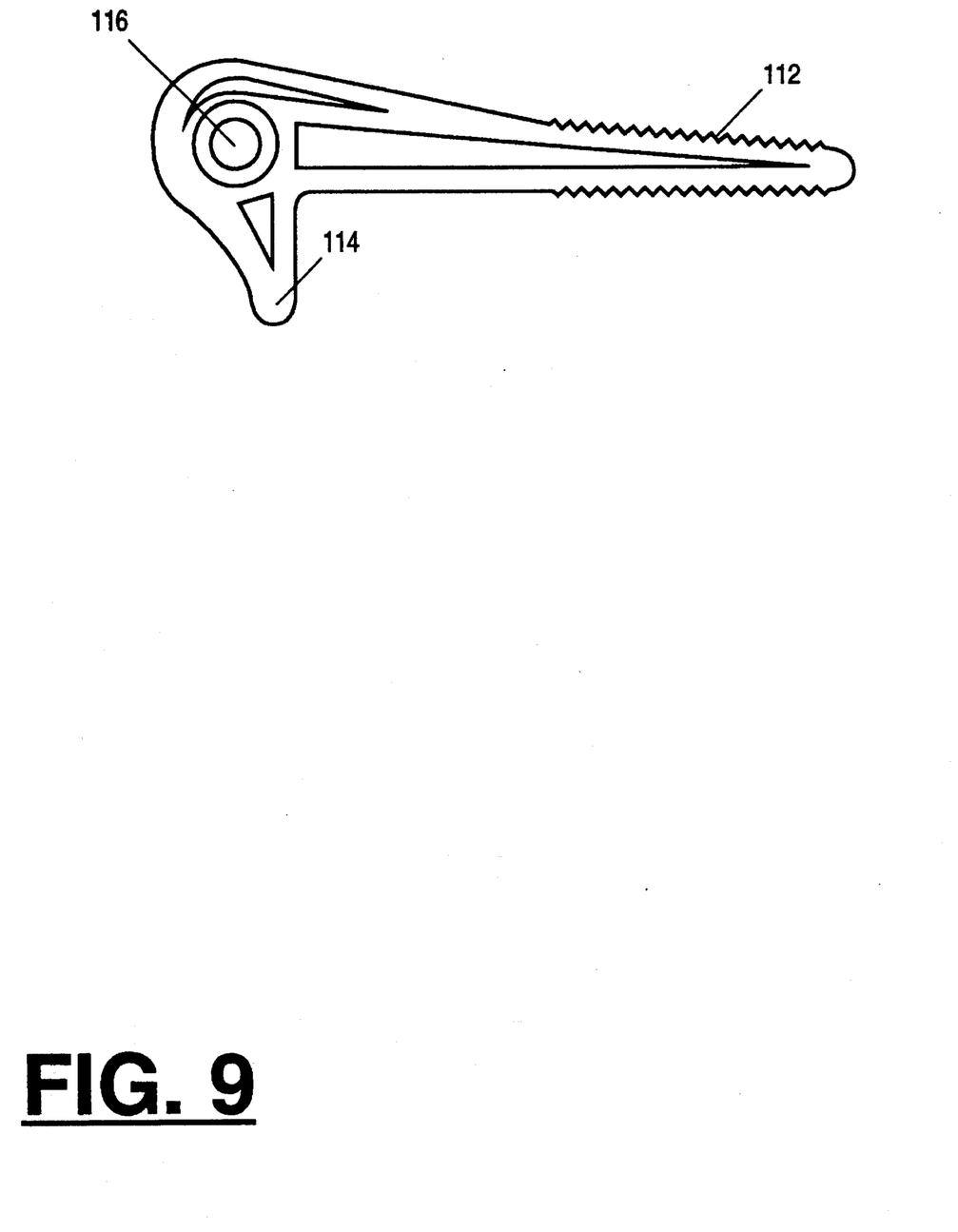
FIG. 9 is a front view of a latch for locking the circuit card in the conductive chassis of FIG. 6.

When the circuit card is fully inserted into chassis 88, plate 92 is secured to the chassis with latches 104 and 106, which pivot on fulcrum pins 108 and 110, respectively. Pins 108 and 110 are rigidly attached to plate 92. As shown in FIG. 9, each latch has a textured handle 112, a locking protrusion 114 substantially orthogonal to handle 112, and a through opening 116 that is used to pivotally mount the latch on the fulcrum pin.

Figure 8:
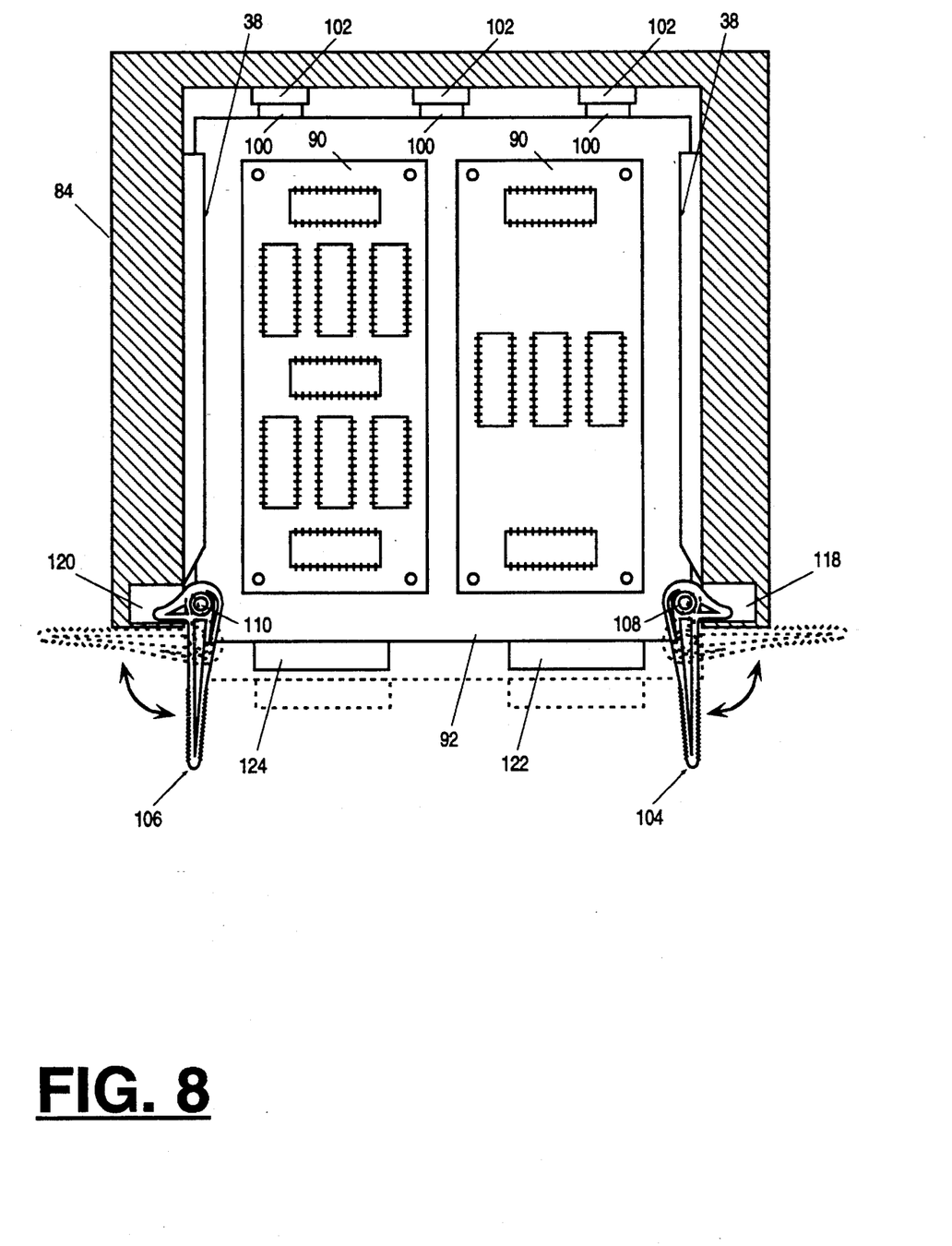
FIG. 8 is a sectional view of the conductive chassis shown in FIG. 6.

Referring to FIG. 8, it is apparent that the handles of latches 104 and 106 are parallel to the trailing edge of the circuit card when the latches are unlocked. The circuit card is secured to chassis 84 by rotating the handles of the latches by 90° so that locking protrusions 114 engage openings 118 and 120 disposed at the front of the chassis. Since handles of latches 104 and 106 fold away from plate 92 to unlock the circuit card, additional space along the trailing edge of the circuit card is available to install LED displays 122 and 124. Such displays are used for indicating the status and the condition of the circuit card.

Due to the gentle radius of curvature of portion 80, the leaf-spring members exert a relatively low pressure on the edge of plate 92, facilitating sliding the card in and out of the guides and minimizing abrasion of the card edge. The relatively large curvature of portion 80 also eliminates snagging of the leaf-spring members on the edge of the card.

Thus, it has been shown that we have provided improved guides for circuit-card grounding which deliver a multiplicity of grounding connections; which directly ground the circuit card to the chassis; which provide corrosion-free grounding contacts; which reduce the sliding friction of the circuit card; which minimize material galling; which facilitate insertion of the circuit card into the chassis; which automatically center the card between the facing chassis members bearing the guides; and which are simple and inexpensive to manufacture and assemble.

Although the supportive guide has been shown and described in the form of a specific embodiment, its configurations and materials are given only as examples, and many other modifications of the guide are possible. For example, the conductive strips may be made of extra-hard stainless steel, phosphor bronze, or any conductive material which resists deformation when flattened. Strips of various thickness may be chosen. Depending on the application, heavier circuitcard modules may require thicker conductive strips. Tracks 50 may be manufactured of lexon, delrin, nylon, noryl, or any polycarbonate material that is UL-approved. The snap-in posts, used to attach the guides to the chassis, may not be slotted or may be replaced with screws or any other type of fastener.

Therefore, the scope of the invention should be determined, not by the examples given, but by the appended claims and their equivalents.

What is claimed is:

1. An apparatus for grounding a circuit card to a chassis, said apparatus comprising;
   tracks for supporting said circuit card, said tracks attached to said chassis: and members having resilient contacts grounding said circuit card to said chassis, said members being sandwiched between said tracks and said chassis, each of said tracks including forked protrusions facilitating insertion of said circuit card into said tracks, said forked protrusions situated at a proximal end of each of said tracks, said forked protrusions obliquely disposed with respect to each other and staggered to enable overlap of the protrusions of adjacently-located tracks, thereby allowing said adjacently-located tracks to be placed directly side-by-side in said chassis and maximizing number of said circuit cards capable of being inserted into said chassis.

2. The apparatus of claim 1 wherein each of said tracks includes a plurality of openings housing said resilient contacts and fasteners located therebetween.

3. The apparatus of claim 1 wherein said tracks are made of non-conductive material.

4. The apparatus of claim 1 wherein each of said tracks further includes a plurality of fasteners for attachment of said tracks to said chassis and for attachment of 5. The apparatus of claim 4 wherein said fasteners comprise snap-in posts, said members having said resilient contacts to said tracks.

6. The apparatus of claim 1 wherein each of said members comprises a flat conductive strip.

7. The apparatus of claim 6 wherein each of said resilient contacts has a proximal end, a curved mid section for engaging said circuit card, and a radiused distal end for engaging said chassis, said proximal end attached to said flat conductive strip.

8. A pair of opposed guides for grounding a circuit card to a conductive chassis, each of said opposed guides comprising;
   a track for supporting said circuit card, said track attached to said conductive chassis and having a proximal end said track including protrusions formed at said proximal end, said protrusions being obliquely disposed with respect to each other, said protrusions being staggered to enable overlap of the protrusions belonging adjacently located tracks, contiguously oriented with respect to each other, thereby allowing said adjacently-located tracks to be placed directly side-by-side in said chassis and maximizing number of said circuit cards capable of being inserted into said chassis; and
   a conductive strip sandwiched between said track and said conductive chassis, said conductive strip having elastic contacts grounding said circuit card to said conductive chassis.

9. The opposed guides of claim 8 wherein said track includes a longitudinal slot for receiving said circuit card and openings for housing said elastic contacts, said openings overlapping said longitudinal slot, said track further including snap-in posts located between said openings.

10. The opposed guides of claim 8 wherein each of said elastic contacts has a proximal end, a curved mid section for engaging said circuit card, and a radiused distal end engaging said conductive chassis, said proximal end attached to said conductive strip.

11. A pair of opposed guides for grounding a circuit card to a conductive chassis, each of said opposed guides comprising:

a supporting track having:
 a proximal end;
 a first side and a second side located opposite each other;
 a longitudinal slot for receiving said circuit card, said longitudinal slot formed in said first side;
 a plurality of openings formed in said second side and joined with said longitudinal slot;
 protrusions formed at said proximal end, said protrusions being obliquely disposed with respect to each other and being staggered to enable overlap of the protrusions belonging to adjacently-located contiguously oriented with respect to each other, thereby allowing said adjacently-located tracks to be placed directly side-by-side in said chassis and maximizing the number of said circuit cards capable of being inserted into said chassis; and
 a plurality of snap-in posts for attachment of said supporting track to said conductive chassis, said snap-in posts located along said second side; and a conductive strip sandwiched between said second side and said conductive chassis and when said guides are secured to said chassis having:
 a plurality of elastic contacts formed along said conductive strip and disposed within said plurality of openings; and
 a plurality of apertures formed along said conductive strip and accommodating said plurality of snap-in posts.

12. The opposed guides of claim 11 wherein each of said plurality of elastic contacts has a proximal end, a curved mid section for slidingly engaging said circuit card, and a radiused distal end for slidingly engaging said conductive chassis, said proximal end attached to said conductive strip.

13. The opposed guides of claim 12 wherein said conductive strip is made of beryllium copper.

14. The opposed guides of claim 11 wherein said apertures have oval shapes and serrations at their peripheries.

15. The opposed guides of claim 11 wherein said supporting track is made of a non-conductive material.

16. The opposed guides of claim 15 wherein said non-conductive material is polycarbonate resin.

* * * * *